(12) United States Patent
Straeussnigg et al.

(10) Patent No.: US 9,100,032 B2
(45) Date of Patent: Aug. 4, 2015

(54) METHODS AND DEVICES FOR ANALOG-TO-DIGITAL CONVERSION

(71) Applicant: Infineon Technologies AG, Neubiberg (DE)

(72) Inventors: Dietmar Straeussnigg, Villach (AT); Andreas Wiesbauer, Poertschach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/453,407

(22) Filed: Aug. 6, 2014

(65) Prior Publication Data

US 2015/0042496 A1    Feb. 12, 2015

(30) Foreign Application Priority Data

Aug. 8, 2013    (DE) .......................... 10 2013 108 573

(51) Int. Cl.
| | |
|---|---|
| *H03M 1/12* | (2006.01) |
| *H03M 1/06* | (2006.01) |
| *H03M 3/00* | (2006.01) |
| *H04R 3/00* | (2006.01) |

(52) U.S. Cl.
CPC .............. *H03M 1/0619* (2013.01); *H03M 3/48* (2013.01); *H04R 3/00* (2013.01); *H04R 2410/00* (2013.01)

(58) Field of Classification Search
CPC ....... H03M 3/48; H03M 3/484; H03M 3/428; H03M 3/438; H03M 3/454; H03M 3/464
USPC ......................................... 341/118, 143, 155
See application file for complete search history.

(56) References Cited

U.S. PATENT DOCUMENTS

| | | | | |
|---|---|---|---|---|
| 5,329,282 | A * | 7/1994 | Jackson ........................ | 341/143 |
| 6,166,668 | A * | 12/2000 | Bautista et al. ............... | 341/118 |
| 7,522,079 | B1 * | 4/2009 | Wu ................................ | 341/143 |
| 7,525,464 | B2 * | 4/2009 | Maloberti et al. ............ | 341/143 |
| 8,344,921 | B2 * | 1/2013 | Lin et al. ...................... | 341/143 |

FOREIGN PATENT DOCUMENTS

DE    102011004895 A1    9/2012

* cited by examiner

*Primary Examiner* — Khai M Nguyen
(74) *Attorney, Agent, or Firm* — Shumaker & Sieffert, P.A.

(57) ABSTRACT

Analog-to-digital converter arrangements and corresponding methods are provided, wherein a reduction signal is subtracted from an analog input signal if a signal level of the input signal exceeds a threshold value.

18 Claims, 6 Drawing Sheets

METHODS AND DEVICES FOR ANALOG-TO-DIGITAL CONVERSION

PRIORITY CLAIM

This application claims priority to German Application Serial No. 102013108573.3, filed Aug. 8, 2013.

TECHNICAL FIELD

The present application relates to methods and devices for analog-to-digital conversion, for example for analog input signals having a high dynamic range.

BACKGROUND

Analog-to-digital converters are generally used to convert an analog signal into a digital signal. In this case, the analog signal can be amplified before conversion.

In the case of many applications, analog signals to be converted have a high dynamic range. By way of example, microphones which can also process very high sound pressure levels, for example up to a sound pressure level of 140 dBSPL or more, are used in many applications. In this case, in conventional devices for analog-to-digital conversion, a dynamic range of an analog-to-digital converter used is designed for the maximum value range which a signal source, such as a microphone, optionally with a downstream amplifier, can supply. Thus, in many applications, an optimum signal-to-noise ratio (SNR, or SNDR: "signal-to-noise and distortion ratio") can be achieved for all signal levels of the analog input signal. However, if the analog input signal has a large dynamic range, as is the case, for example, in many microphone applications, an analog-to-digital converter used in this approach may be designed accordingly for the entire large dynamic range, which generally results in a significant overhead in terms of space and/or power loss and is technically difficult to realize at reasonable expense for many applications.

BRIEF SUMMARY

An analog-to-digital converter arrangement as claimed in claim 1 and a method as claimed in claim 16 are provided. The dependent claims define further exemplary embodiments.

For example, the disclosure describes examples of analog-to-digital converter arrangements and corresponding methods which can process input signals with a high dynamic range, and potentially require smaller space and/or smaller current consumption as compared to some examples of analog-to-digital converter arrangements.

DETAILED DESCRIPTION OF EXEMPLARY EMBODIMENTS

Figure 1:
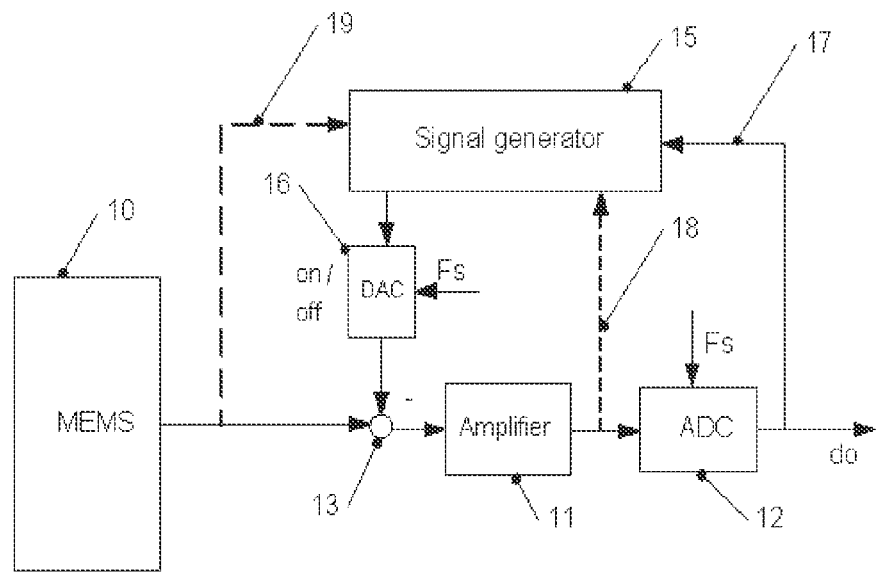
FIG. 1 is a block diagram of a device according to an exemplary embodiment.

Exemplary embodiments are explained in detail in the following text with reference to the appended drawing. It should be noted that these exemplary embodiments serve merely by way of illustration and are not to be interpreted as restrictive. Other implementations than the illustrated exemplary embodiments are also possible.

Features of different exemplary embodiments can be combined with one another, unless indicated otherwise. In addition, a description or illustration of an exemplary embodiment with a multiplicity of elements is not to be interpreted to the extent that all of said elements are necessary for implementation. Rather, in other exemplary embodiments, many of the illustrated elements can be omitted or replaced by alternative features. Additional features can also be provided in other exemplary embodiments.

Any described coupling between elements of the exemplary embodiments can be implemented with a direct coupling, that is to say a coupling without an element lying in between, or with an indirect coupling, that is to say a coupling with one or more elements lying in between, unless indicated otherwise and provided that the purpose of the coupling, for example to transfer a signal or an item of information between two elements, is maintained. Transfers of such signals or items of information can take place in a wired or wireless manner.

In the case of many of the illustrated exemplary embodiments, an analog input signal is amplified by an amplifier and subsequently converted into a digital signal by an analog-to-digital converter. If a signal level of the analog input signal exceeds a threshold value, such as a predefined threshold value, a reduction signal is subtracted from the analog input signal, before the analog input signal is supplied to the amplifier. The reduction signal can in this case be generated, for example, on the basis of the analog input signal, an output signal of the amplifier or an output signal of the analog-to-digital converter; however, it is not limited thereto.

According to one aspect, an analog-to-digital converter arrangement is provided, comprising:

an analog signal input for receiving an analog input signal, an amplifier, wherein an input of the amplifier is coupled to the analog signal input, an analog-to-digital converter, wherein an input of the analog-to-digital converter is coupled to an output of the amplifier, and a signal correction device, which is set up to subtract a reduction signal from the analog input signal, before the analog input signal is supplied to the amplifier, if a signal level of the analog input signal is above a threshold value.

In the case of such an analog-to-digital converter arrangement, the signal correction device can be set up to electrically isolate at least one part of the signal correction device from a signal path between the analog signal input and the amplifier if the signal level of the analog input signal is below the threshold value, for example by switching off a digital-to-analog converter used to generate the reduction signal and/or by a connection for supplying the reduction signal being switched so as to be highly resistive.

Owing to the reduction of the input signal by the reduction signal in the event of relatively high signal levels, the analog-to-digital converter can be designed for a narrower range of values in many exemplary embodiments. To compensate for the reduction of the analog input signal, a compensation signal, which can substantially correspond, for example, to the amplified reduction signal, can then be added, for example, to an output signal of the analog-to-digital converter.

In many exemplary embodiments, a signal-to-noise ratio of an ultimately output signal may be worse than in the case in which an analog-to-digital converter which is designed for the entire range of values of the analog input signal is used. However, in many applications, this is harmless, for example in acoustic applications in which signals supplied from a microphone are processed. In this case, for example from a certain sound level, a slightly deteriorated signal-to-noise ratio leads to practically no audible deterioration in an ultimately output signal.

In many exemplary embodiments, at signal levels below the threshold value, one or more components which are used to form and/or to subtract the reduction signal are electrically decoupled. In many exemplary embodiments, this results in such components not contributing to deterioration in a signal-to-noise ratio of an output digital signal in the case of low signal levels, for instance signal levels below the threshold value. Electrical decoupling such as this can comprise switching off a digital-to-analog converter, for example.

FIG. 1 illustrates a block diagram of an analog-to-digital converter arrangement according to an exemplary embodiment. In the exemplary embodiment in FIG. 1, an analog input signal for the analog-to-digital converter arrangement is generated by a signal source 10, for example a microphone, which can be implemented as microelectromechanical system (MEMS). However, other signal sources can also be used.

The input signal is supplied to a positive input of a subtractor 13. As will be explained below in more detail, at high signal levels of the analog input signal, a reduction signal is supplied to a negative input of the subtractor 13, with the result that in this case a difference between the analog input signal and the reduction signal is output at an output of the subtractor 13. In the event of lower signal levels of the analog input signal, such as signal levels below the threshold value, no reduction signal is supplied, with the result that substantially the analog input signal is output at the output of the subtractor 13.

The output of the subtractor 13 is coupled to an input of an amplifier 11. The amplifier 11 is used to amplify the analog input signal (optionally reduced by the reduction signal) and can amplify the signal supplied to it, for example, by a factor of between 2 and 10, for example, by approximately a factor of 5, wherein other amplification factors can also be used, depending on application and requirements. In this case, the amplifier 11 can be implemented as a low-noise amplifier (LNA). A low-noise amplifier such as this can be realized in any conventional manner.

An output of the amplifier 11 is coupled to an input of an analog-to-digital converter (ADC) 12 which converts the signal amplified by the amplifier 11 at a sampling rate Fs into a digital signal which, in the exemplary embodiment in FIG. 1, corresponds to an output signal, do as illustrated in FIG. 1, of the arrangement. The analog-to-digital converter 12 can be implemented, for example, as a sigma-delta converter of any order or as an analog-to-digital converter according to the successive approximation method (SAR: successive approximation register). However, other types of analog-to-digital converter can also be used.

In the exemplary embodiment in FIG. 1, a signal generator 15 is also provided, which signal generator receives the digital output signal (referred to as do in FIG. 1)—as indicated by an arrow 17—in order to generate the above-mentioned reduction signal in digital form. Options for generating the reduction signal and thus for implementing the signal generator 15 are explained in more detail below.

The reduction signal in digital form is then converted by means of a digital-to-analog converter (DAC) 16 into an analog form and, as already explained above, supplied to the negative input of the subtractor 13. In this case, in the exemplary embodiment in FIG. 1, the digital-to-analog converter 16 likewise operates at the sampling rate Fs. In the exemplary embodiment in FIG. 1, the signal generator 15 generates the reduction signal as a signal different from zero only if the output signal do indicates that the analog input signal exceeds a threshold value. By way of example, the reduction signal can be generated shortly before the digital output signal do reaches saturation or when it reaches saturation, that is to say a maximum value. In addition or as an alternative to the digital output signal do, the reduction signal can also be determined—as indicated by an arrow 18—on the basis of the signal output from the amplifier 11 or—as indicated by an arrow 19—on the basis of the analog input signal.

The digital-to-analog converter 16 can in this case be optimized in respect of current consumption and/or space requirements, for example a so-called low-power design.

The digital-to-analog converter 16 is additionally switched off in the exemplary embodiment in FIG. 1 if no reduction signal is generated, that is to say if the signal level of the analog input signal is below the threshold value. In the context of the present application, switching off the digital-to-analog converter 16 means that the digital-to-analog converter 16 is electrically isolated from the negative input of the subtractor 13. As a result of this, the digital-to-analog converter 16, and optionally also the signal generator 15, in the switched-off state is/are not a disturbing load on the subtractor 13. In many exemplary embodiments, this can, in this case, prevent the digital-to-analog converter 16 from impairing, by means of the load represented by said digital-to-analog converter, a signal-to-noise ratio of the digital output signal do in a region in which the signal level of the analog input signal is below the threshold value. Said switching-off or electrical isolation can be done, for example, by means of a switch at the output of the digital-to-analog converter 16 which is connected to the negative input of the subtractor 13.

In many exemplary embodiments, the electrical isolation comprises a coupling to the negative input of the subtractor 13 being switched so as to be highly resistive, for example by means of the mentioned switching-off of the digital-to-analog converter 13. By way of example, "highly resistive" can mean, in this connection, an electrical resistance of a few kΩ, a few 100 kΩ or even in the range of MΩ. Therefore, electrical isolation does not necessarily imply an "ideal" isolation with an infinite resistance, rather a highly resistive connection can be used, for example in order to provide a defined potential, for example corresponding to the value zero, at the negative input of the subtractor 13. If the signal level of the analog input signal then exceeds the threshold value, the digital-to-analog converter 16 is switched on, for instance, is electrically coupled to the negative input of the subtractor 13 again. The switching-on or switching-off can be controlled, for example, by the signal generator 15. The switching-on and switching-off can, in addition to the electrical isolation or coupling to the negative input of the subtractor 13, additionally comprise isolation and connection to a voltage source, or reduction of a voltage in the switched-off state in order thus to reduce the current consumption in the switched-off state.

In the event that the reduction signal is subtracted from the analog input signal, a digital compensation signal can also be added to the digital output signal do at the analog-to-digital converter 12 in order to ensure a substantially correct profile of the output signal do on the basis of the analog input signal, for example without a jump or only with a small jump when the signal level of the input signal exceeds the threshold value. The addition of such a compensation signal is not explicitly illustrated in FIG. 1 but is explained later on the basis of examples with reference to FIGS. 2-4 and 6.

Figure 2:
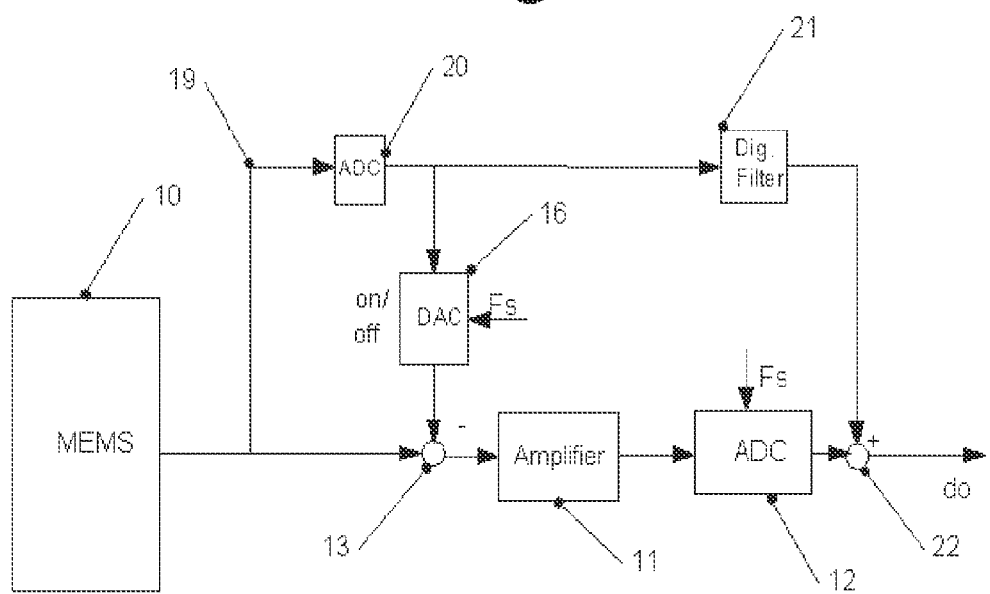
FIG. 2 is a block diagram of a device according to another exemplary embodiment.

FIG. 2 illustrates a further exemplary embodiment. Elements of the exemplary embodiment in FIG. 2 which correspond to elements of the exemplary embodiment of FIG. 1 carry the same reference signs and are not explained again. For example, the exemplary embodiment in FIG. 2 also comprises a signal source 10, a subtractor 13, an amplifier 11, an analog-to-digital converter 12 and a digital-to-analog converter 16. All of the variants and modifications of said elements which have been discussed with reference to FIG. 1 are also applicable to the exemplary embodiment of FIG. 2.

In the exemplary embodiment of FIG. 2, an analog-to-digital converter 20, to which the analog input signal which is output from the signal source 10 is supplied—as illustrated by an arrow 19—, is used as signal generator. The analog-to-digital converter 20 performs in this case a coarse quantization of the signal with comparatively few steps, for example four steps or eight steps. In this case, the analog-to-digital converter 20 can be configured, for example, such that, in the event of signal levels of the analog input signal which are below the threshold value, it outputs the value 0, and only outputs a value which is different from 0 in the event of values above the threshold value. Via said value output by the analog-to-digital converter 20, the switching-on and switching-off of the digital-to-analog converter 16 can then also be controlled substantially as explained with reference to FIG. 1, that is to say if the analog-to-digital converter 20 outputs the value 0, the digital-to-analog converter 16 is switched off, and is switched on in the event of a value different from 0. The digital-to-analog converter 16 then converts the digital signal output by the analog-to-digital converter 20 back into an analog signal in order to generate the reduction signal which is supplied to the negative input of the subtractor 13. Thus, in the exemplary embodiment in FIG. 2, at signal levels above the threshold value, only the "remainder", that is to say the analog input signal minus a signal which emerges from the coarse quantization of the analog input signal by the analog-to-digital converter 20, is amplified by the amplifier 11 and converted by the analog-to-digital converter 12. The analog-to-digital converter 12 may therefore be designed only for a comparatively narrow range of values, in this example. Moreover, the analog-to-digital converter 20 can be constructed in a relatively simple manner since it may only perform coarse quantization.

In addition, the digital output signal of the analog-to-digital converter 20 is supplied to a digital filter 21. An output signal of the digital filter 21 is supplied to an input of an adder 22. The output signal of the analog-to-digital converter 12 is supplied to a further input of the adder 22. The adder 22 then outputs the digital output signal, illustrated as do in FIG. 2. For instance, a compensation signal is generated by the digital filter 21 in order to compensate for the lowering of the signal level by the reduction signal at the subtractor 13 and to generate a digital output signal do which substantially corresponds to the analog input signal. In this example, the digital filter 21 can emulate a signal transfer function of the analog-to-digital converter 12, for example a loop filter in the case of a sigma-delta converter, with the result that the compensation signal "matches" the output signal of the analog-to-digital converter 12. A signal transfer function of the amplifier 11 can also be taken into account by means of the digital filter 21.

Figure 3:
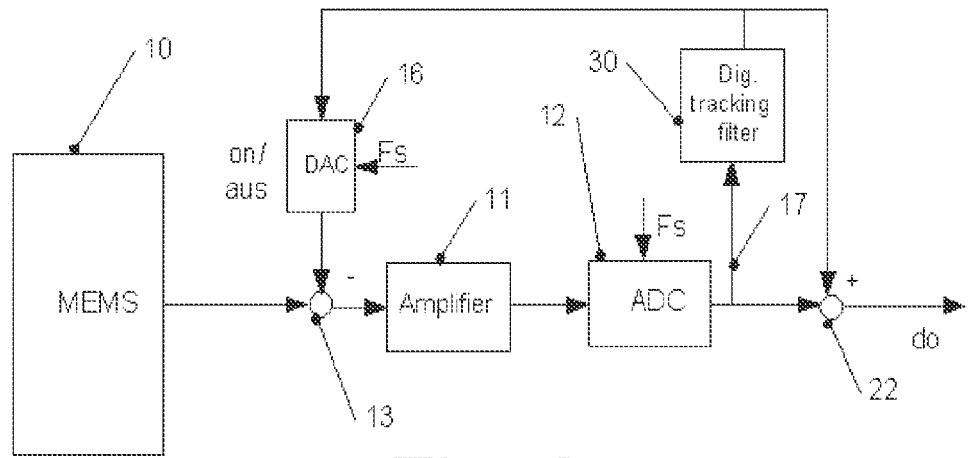
FIG. 3 is a block diagram of a device according to another exemplary embodiment.

Another exemplary embodiment of an analog-to-digital converter arrangement is illustrated in FIG. 3. Again, elements which have already been discussed in relation to FIG. 1 or FIG. 2 are designated with the same reference signs and are not explained in detail again.

In the case of the exemplary embodiment of FIG. 3, a digital tracking filter 30 is used as signal generator. The output signal of the analog-to-digital converter 12 is supplied to the digital tracking filter 30—as is illustrated by an arrow 17. An output of the digital tracking filter 30 is supplied firstly to the digital-to-analog converter 16 and secondly to an input of the adder 22. Thus, firstly, via the output signal of the digital tracking filter 30, as reduction signal, is subtracted from the analog input signal via the digital-to-analog converter 16 and the subtractor 13 and, secondly, as compensation signal, is added to the output signal of the analog-to-digital converter 12 by the adder 22. If the output signal of the analog-to-digital converter 12 indicates that a signal level of the analog input signal exceeds the threshold value mentioned above, a corresponding reduction signal and compensation signal are generated by means of the digital tracking filter. In contrast, in the case of a low signal level of the input signal, a 0 is output, for example, in exemplary embodiments. In the case of the exemplary embodiment in FIG. 3, this then leads in turn to the digital-to-analog converter 16 being switched off, that is to say an electrical isolation of the digital-to-analog converter 16 from the subtractor 13, as explained above.

Figure 4:
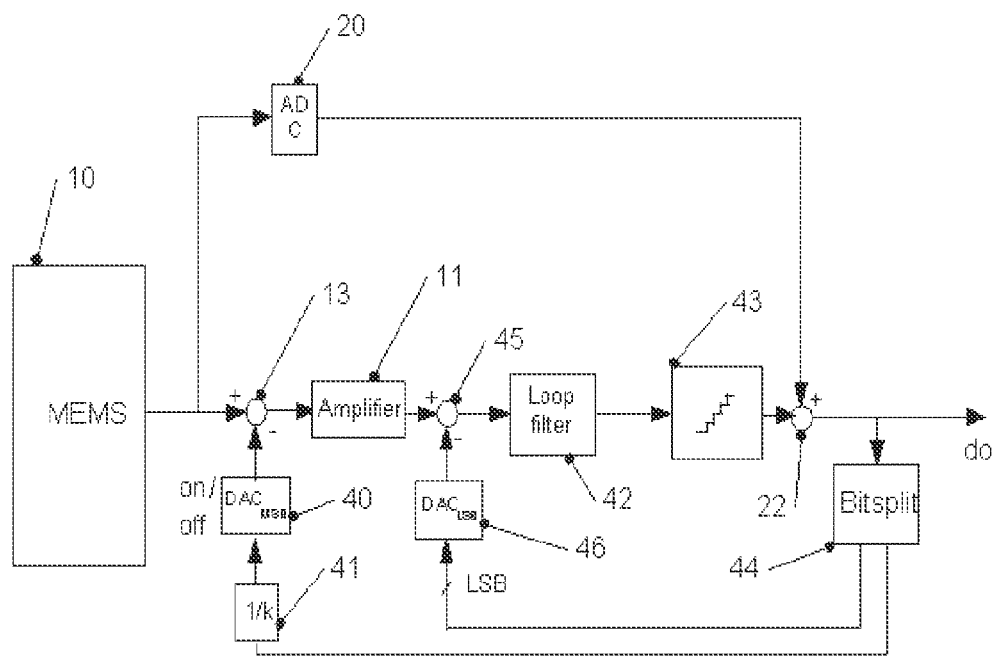
FIG. 4 is a block diagram of a device according to another exemplary embodiment.

A block diagram of another exemplary embodiment of an analog-to-digital converter arrangement is illustrated in FIG. 4. Again, elements which correspond to elements which have already been discussed in relation to FIGS. 1-3 are designated with the same reference signs and are not explained in detail again.

In the case of the exemplary embodiment of FIG. 4, a sigma-delta converter, for example a first-order sigma-delta converter, is used as analog-to-digital converter which receives the output signal of the amplifier 11. In the case of the exemplary embodiment in FIG. 4, the sigma-delta converter comprises a loop filter 42, a quantizer 43, a digital-to-analog converter 46 and a subtractor 45. The loop filter can act, for example, as an integrator. A design of a sigma-delta digital-to-analog converter with loop filter, quantizer and feedback of an output signal via a digital-to-analog converter such as the digital-to-analog converter 46 in order to subtract said signal from an input signal of the converter in a subtractor such as the subtractor 45, may corresponds to a design of a first-order sigma-delta digital-to-analog converter. In the case of other exemplary embodiments, other types of sigma-delta converters, for example of a higher order, can also be used.

In the case of the exemplary embodiment of FIG. 4, an analog input signal generated by the signal source 10 is firstly supplied to a positive input of the subtractor 13 and secondly to the analog-to-digital converter 20 which—as already explained with reference to FIG. 2—performs a coarse quantization and can be set up such that it outputs a 0 in the event of signal levels of the analog input signal which are below a threshold value. In the latter case, the analog-to-digital converter arrangement acts as an analog-to-digital converter arrangement with amplifier and downstream digital-to-analog converter.

However, in the case of higher signal levels, the analog-to-digital converter 20 outputs a digital signal which is different from 0. The signal output by the analog-to-digital converter 20 is supplied to an input of the adder 22, which in this case is connected downstream of the quantizer 43 and is arranged "within" the sigma-delta digital-to-analog converter. The output signal of the quantizer 43 is supplied to a second input of the adder 22. An output signal of the adder 22 is firstly used as digital output signal do of the arrangement in FIG. 4.

Secondly, the output signal of the adder 22 is supplied to a bit splitter device 44 which divides the signal output by the adder 22 into low-value bits (LSB: "least significant bits") and high-value bits (MSB: "most significant bits"). In this case, the division can take place such that the high-value bits correspond to those bits which can take the value 1 if the analog input signal is above the threshold value. In other words, in this case the high-value bits and thus a signal formed from the high-value bits have the value 0 if the signal is below the threshold value. Another division is also possible.

The low-value bits are supplied to the digital-to-analog converter 46 in the feedback loop of the sigma-delta converter. The high-value bits are supplied to a digital-to-analog converter 40 via a scaler 41 which, in the illustrated exemplary embodiment, performs scaling by 1/k, wherein k is the amplification factor of the amplifier 11. The digital-to-analog converter 40 corresponds in terms of its function to the digital-to-analog converter 16 in FIGS. 1-3. An output of the digital-to-analog converter 40 is connected to a negative input of the subtractor 13 and thus provides a reduction signal.

In the exemplary embodiment in FIG. 4, compensation occurs by virtue of the output signal of the analog-to-digital converter 20 being supplied to the adder 22. As explained for the digital-to-analog converter 16 of the preceding exemplary embodiments, the digital-to-analog converter 40 can be switched off if the high-value bits which are supplied thereto have the value 0. This can mean electrical isolation from the subtractor 13, with the result that the digital-to-analog converter 40, even in the switched-off state, does not represent a load for the signal chain via the amplifier 11 and the sigma-delta digital-to-analog converter and thus does not impair the noise performance in the event of low signal levels.

Since, in the case of the exemplary embodiment in FIG. 4, the output signal of the analog-to-digital converter 20 is fed in by means of the adder 22 within the loop of the sigma-delta digital-to-analog converter, no digital filter such as the digital filter 21 from FIG. 2 may be necessary in this case in order to emulate, for example, the loop filter 42. In many exemplary embodiments, this can suppress or reduce problems such as non-idealities which can arise through mismatching or insufficient concordance of different components, for example by deviations between the behavior of a loop filter and a digital filter which emulates the loop filter.

Figure 5:
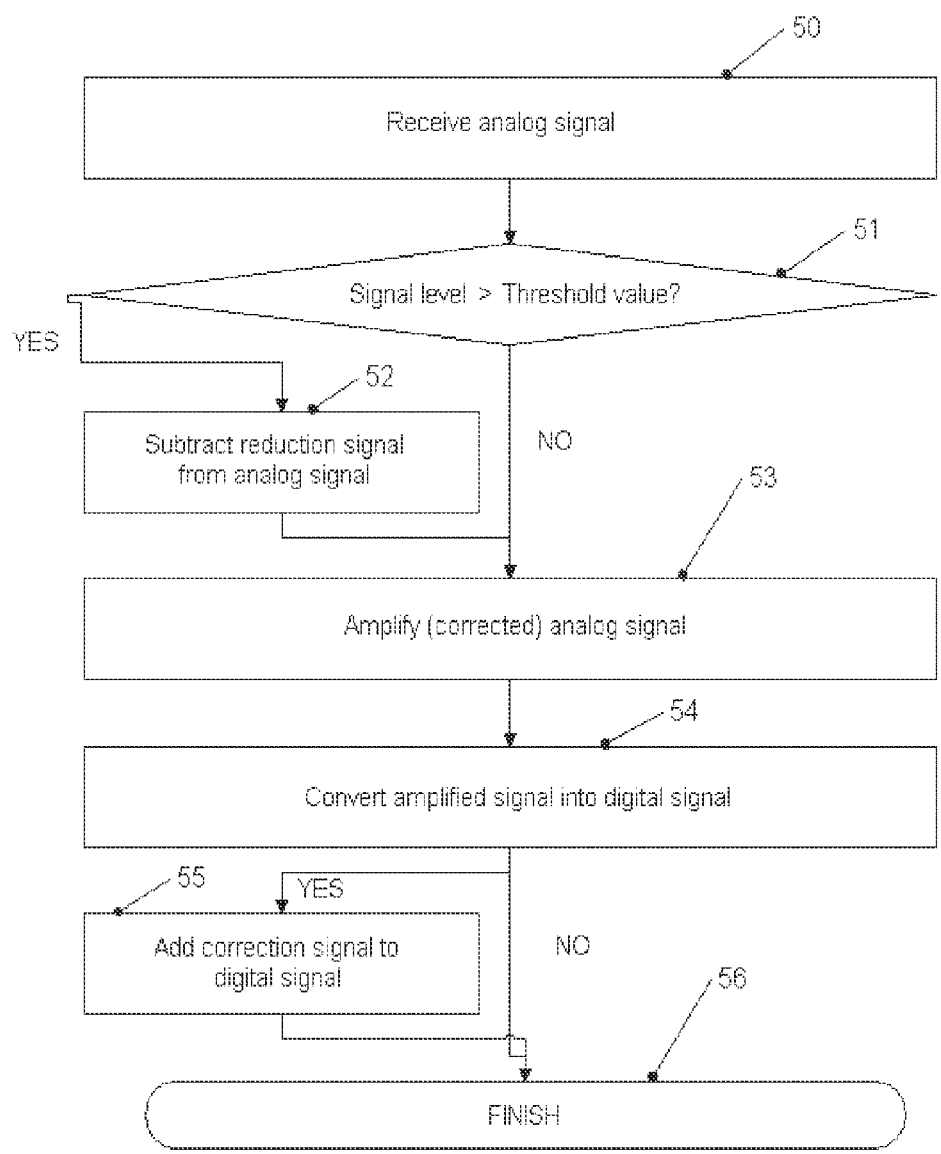
FIG. 5 is a flow chart to illustrate a method according to an exemplary embodiment.

FIG. 5 illustrates a flow chart to illustrate a method according to an exemplary embodiment. The method in FIG. 5 can be implemented, for example, by means of one of the analog-to-digital converter arrangements in FIGS. 1-4; however, it can also be used independently thereof.

While the method in FIG. 5 is illustrated as a sequence of different processes, the processes do not necessarily have to be performed in the illustrated sequence. Many of the illustrated processes can also be performed simultaneously, and the processes can be performed repeatedly, for example, in time with a sampling rate.

At 50, an analog signal is received as input signal, for example, from a signal source such as a microphone. If the signal level of the analog signal is above a threshold value (YES at 51), a reduction signal is subtracted from the analog signal at 52. In this case, at 53, the analog signal corrected (e.g., reduced by the reduction signal) is amplified, otherwise the analog signal substantially as it was received at 50 is amplified.

It should be noted that the check whether the signal level is above the threshold value does not necessarily have to be implemented by an explicit comparison of the signal level with the threshold value. A circuit used to implement the method can also be configured such that a reduction signal is subtracted from the analog signal only when the threshold value is exceeded, for example by using an analog-to-digital converter with correspondingly coarse quantization as explained with reference to FIGS. 2 and 4 or by using a digital tracking filter as explained with reference to FIG. 3.

At 54, the analog signal amplified at 53 is then converted into a digital signal, for example by means of a sigma-delta digital-to-analog converter or another suitable converter.

If, at 51, the signal level was not above the threshold value, the thus converted signal represents the output signal, and the method is ended at 56. Otherwise, at 55, a compensation signal is added to the digital signal in order to compensate for the reduction of the input value before the conversion at 52. By way of example, this can be done by means of an adder such as the adder 22 of FIGS. 2-4. As explained with reference to FIG. 5, the correction signal can in this case also be added within an analog-to-digital converter used for the conversion at 54, for example in a loop of a sigma-delta converter.

Figure 6:
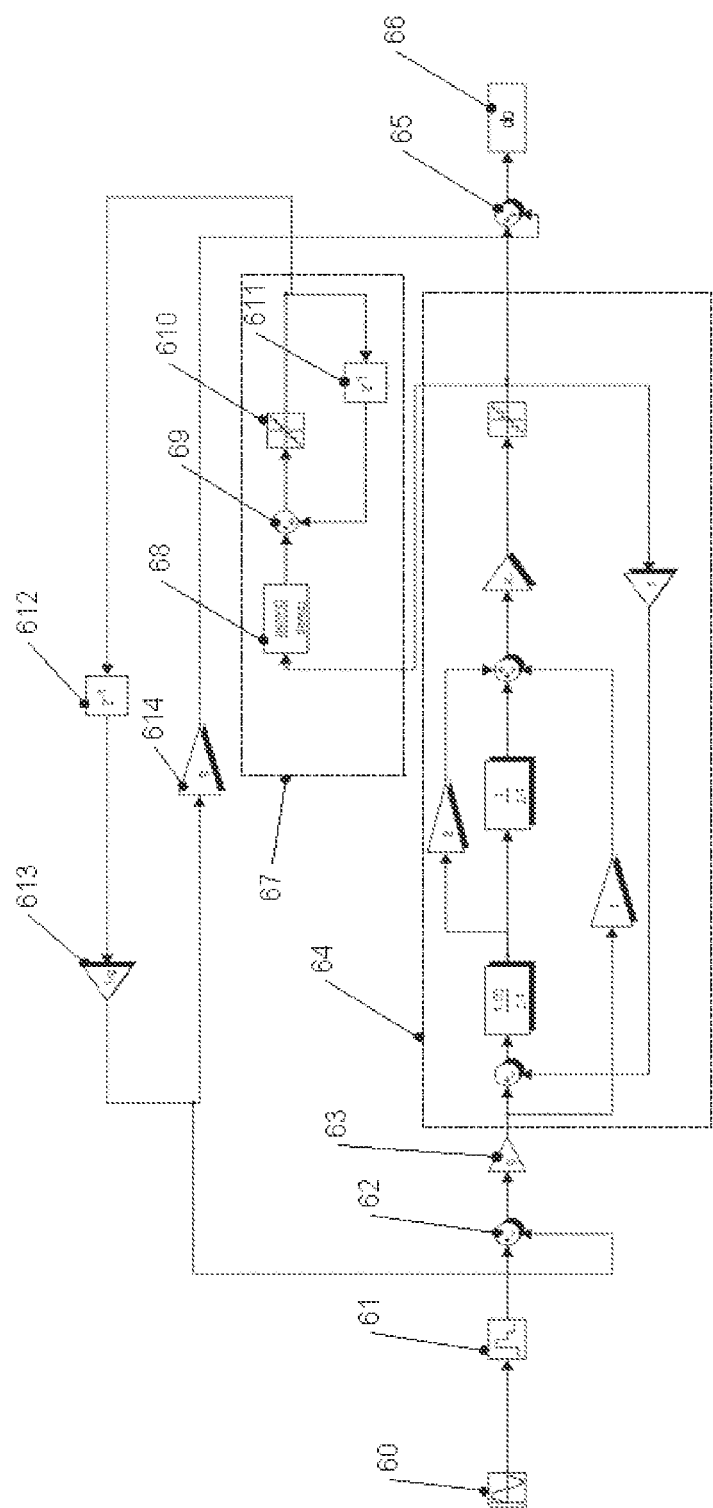
FIG. 6 is a block diagram of a device which is based on a simulation of an exemplary embodiment.

To illustrate the functionality of exemplary embodiments, simulation results of an exemplary embodiment are illustrated below. FIG. 6 schematically shows an arrangement used for the simulation, which arrangement represents a simulation implementation of the exemplary embodiment in FIG. 3.

A sine wave 60 is used as signal source for simulation purposes, which sine wave is supplied to a zero-order hold element 61. The signal thus generated is supplied to a subtractor 62 which substantially corresponds to the subtractor 13 in FIG. 3, that is to say serves to subtract a reduction signal if the signal level of the input signal generated by the elements 60, 61 exceeds a threshold value. An output signal of the subtractor 62 is supplied to an amplifier 63 with amplification factor g, which amplifier substantially corresponds to the amplifier 11 in FIG. 3.

An output signal of the amplifier 63 is supplied to a sigma-delta analog-to-digital converter 64 which is designed as illustrated. However, it should be noted that the illustrated design of the sigma-delta analog-to-digital converter serves as an example and other implementations are likewise possible.

The output signal of the sigma-delta analog-to-digital converter 64 is firstly supplied to an adder 65 which substantially corresponds to the adder 22 in FIG. 3, that is to say is used to add a compensation signal. An output signal of the adder 65 forms a digital output signal 66. Secondly, the output signal of the sigma-delta analog-to-digital converter 64 is supplied to a digital tracking filter 67 which substantially corresponds to the filter 30 in FIG. 3.

The tracking filter 67 firstly comprises a filter component 68 with a signal transfer function num(z)/den(z), wherein num(z) is the numerator and den(z) is the denominator. In this case, the signal transfer function is suitably selected to generate a desired output signal which, for example, is equal to 0 below a threshold value of the input signal and is different from 0 above the threshold value. In addition, the digital tracking filter 67 comprises a device for re-quantization with an adder 69, a quantizer 610 and a delay element 611 in a feedback loop. By means of the device for re-quantization, a coarser quantization of the output signal for the simulation is achieved.

The output signal of the digital tracking filter 67 is supplied to a negative input of the subtractor 62 via a delay element 612 and a scaler 613 which uses a scaling factor 1/g. The scaler 613 thus compensates for the amplification of the amplifier 63 which has received the signal. In addition, the output signal of the tracking filter is supplied to an input of the adder 65 as compensation signal via an amplifier 614 which reverses the effect of the scaler 613 again. The illustrated manner of implementation with the scaler 613 and the amplifier 614 is used in this case for simulation purposes and, in a hardware implementation, the output signal of the tracking filter 67 can also be supplied in another way to the subtractor 62 as reduction signal and to the adder 65 as compensation signal.

Figure 7:
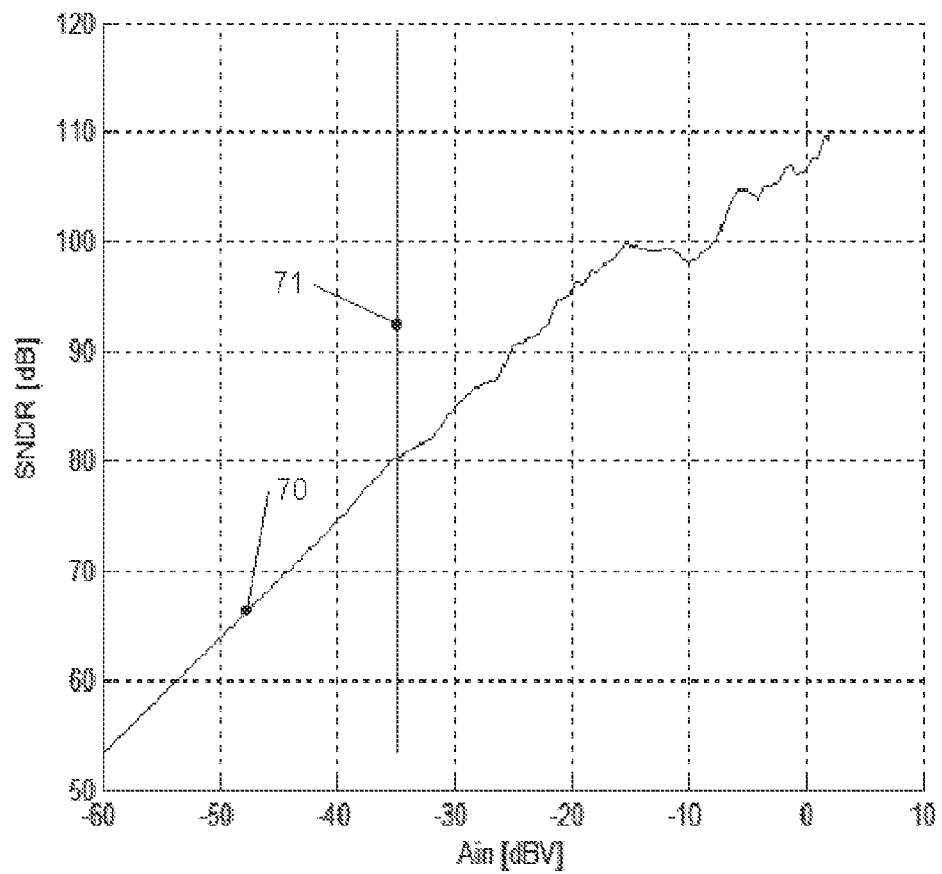
FIG. 7 is a graph which shows a simulation result of the exemplary embodiment in FIG. 6.

FIG. 7 shows a curve 70, a profile of the signal-to-noise and distortion ratio SNDR in dB over an entire amplitude range Ain of the input signal in dBV. In the illustrated example, the threshold value above which the digital tracking filter 67 in FIG. 6 generates a reduction signal and a compensation signal, is at an input level of approximately 100 dBSPL. A line 71 shows an input level of 94 dBSPL. As can be seen, the signal-to-noise ratio firstly increases in a linear fashion with the input level. Even at a higher level, if a reduction signal and a compensation signal are present, an approximately linear rise still occurs, wherein deviations as mentioned at the outset are of no consequence here in many applications since, in the case of such high noise levels, moderate deterioration of the signal-to-noise ratio does not lead to noticeably audible losses in quality of the resulting signal.

Figure 8:
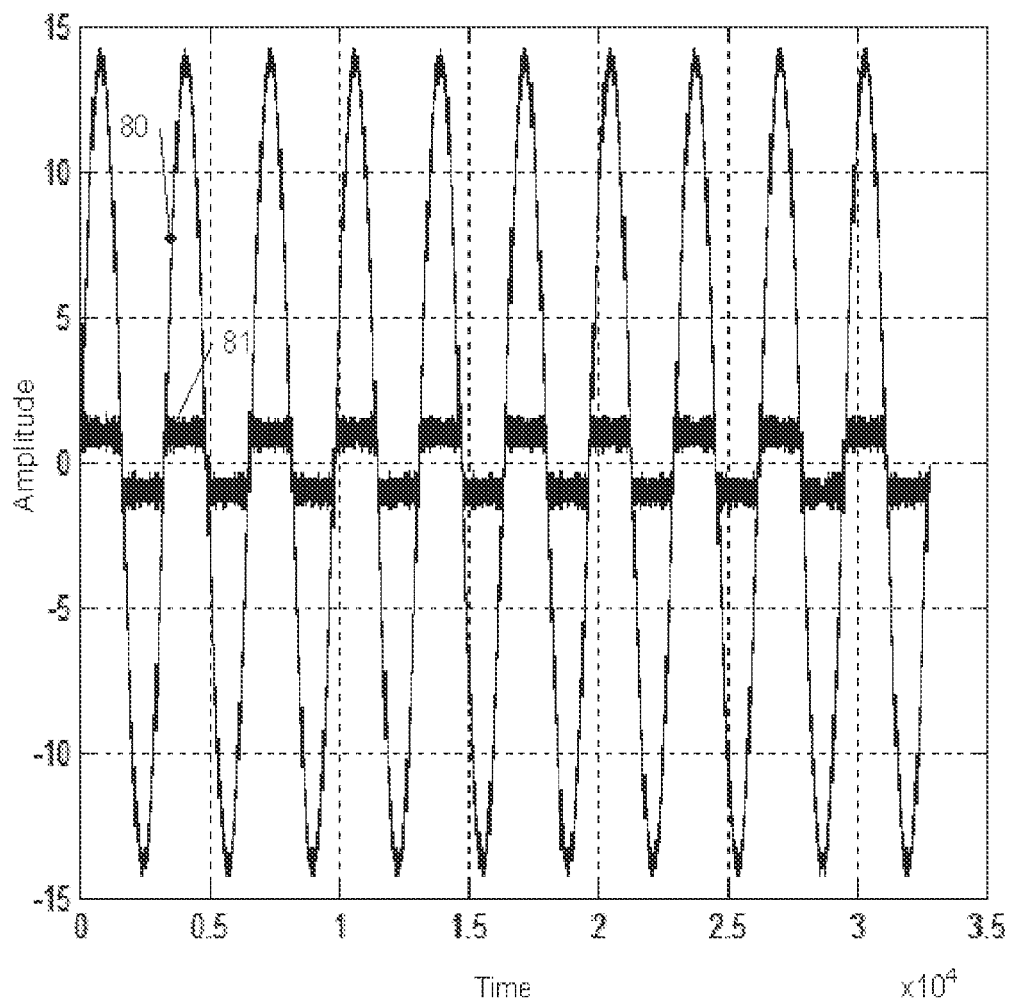
FIG. 8 is a graph which shows another simulation result of the exemplary embodiment in FIG. 6.

FIG. 8 illustrates a diagram of the input signal against time in order to exemplify the effect of the reduction signal. The analog input signal upstream of the subtractor 62 is designated by 80 and, in this case, has a signal level which is significantly above the threshold value. After the reduction signal has been deducted, a signal 81—illustrated in FIG. 8—with a significantly lower level remains, with the result that a range of values of a subsequent analog-to-digital converter such as the analog-to-digital converter 64 in FIG. 6 does not have to be designed for the entire possible range of values of the signal 80. In this case, the sinusoidal waveform of the signal 80 is used merely for the purpose of illustration and, in practical applications of exemplary embodiments, any waveforms, for example waveforms generated by a microphone on the basis of recorded sound, can occur.

The exemplary embodiments illustrated above represent merely some possibilities for implementation, and other exemplary embodiments are also possible. By way of example, other types of signal sources than those illustrated or other types of analog-to-digital converters can be used.

What is claimed is:

1. An analog-to-digital converter arrangement, comprising:
    an analog signal input configured to receive an analog input signal,
    a subtractor, wherein a positive input of the subtractor is coupled to the analog signal input,
    an amplifier, wherein an input of the amplifier is coupled to an output of the subtractor,
    an analog-to-digital converter, wherein an input of the analog-to-digital converter is coupled to an output of the amplifier, and
    a signal correction device comprising a bit splitter arrangement, wherein an input of the bit splitter arrangement is coupled to an output of the analog-to-digital converter, wherein the bit splitter arrangement is configured to divide a supplied digital signal into a first signal with high-value bits and a second signal with low-value bits, and wherein the signal correction device is configured to form a reduction signal on the basis of the first signal and to supply the reduction signal to a negative input of the subtractor.

2. The analog-to-digital converter arrangement of claim 1, wherein the signal correction device is configured to electrically isolate at least one part of the signal correction device from a signal path between the analog signal input and the amplifier if the first signal has a value of 0.

3. The analog-to-digital converter arrangement of claim 1, wherein the signal correction device comprises a digital-to-analog converter, wherein the negative input of the subtractor is coupled to an output of the digital-to-analog converter, and wherein the signal correction device is configured to supply the first signal to an input of the digital-to-analog converter,
    wherein the signal correction device is further configured to switch off the digital-to-analog converter if the first signal has a value of 0.

4. The analog-to-digital converter arrangement of claim 1, wherein the analog-to-digital converter comprises a feedback path, wherein the signal correction device is configured to supply the second signal to the feedback path.

5. The analog-to-digital converter arrangement of claim 1, wherein the signal correction device is further configured to add a digital compensation signal to a signal at an output of the analog-to-digital converter if the first signal indicates a value different from 0.

6. The analog-to-digital converter arrangement of claim 5, wherein the analog-to-digital converter comprises a sigma-delta converter, and wherein the signal correction device is configured to add the digital compensation signal within a loop of the sigma-delta converter.

7. The analog-to-digital converter arrangement of claim 6, wherein the signal correction device comprises a further analog-to-digital converter and an adder, wherein an input of the further analog-to-digital converter is coupled to the analog signal input, wherein an output of a quantizer of the sigma-delta converter is coupled to a first input of the adder and an output of the further analog-to-digital converter is connected to a second input of the adder, wherein an output of the adder is coupled to a digital signal output of the analog-to-digital converter arrangement.

8. The analog-to-digital converter arrangement claim 7, wherein the output of the adder is coupled to the bit splitter arrangement,
    wherein the second signal with low-value bits is supplied via a digital-to-analog converter and a loop filter to an input of the quantizer.

9. The analog-to-digital converter arrangement of claim 1, wherein the first signal is only different from 0 if the signal level of the analog input signal is above a threshold value.

10. The analog-to-digital converter arrangement of claim 1, wherein the signal correction device comprises a further analog-to-digital converter, wherein an input of the further analog-to-digital converter is coupled to the analog signal input, and wherein the signal correction device is configured to generate the reduction signal on the basis of an output signal of the further analog-to-digital converter.

11. The analog-to-digital converter arrangement of claim 10, further comprising a digital filter, wherein an input of the digital filter is coupled to an output of the further analog-to-digital converter, and wherein an output of the digital filter is coupled to an output of the analog-to-digital converter,
    wherein the digital filter emulates a signal transfer function of the analog-to-digital converter.

12. The analog-to-digital converter arrangement of claim 10, wherein quantization stages of the further analog-to-digital converter are selected such that the further analog-to-digital converter only outputs a signal which is different from 0 if the signal level of the analog input signal exceeds a threshold value.

13. The analog-to-digital converter arrangement of claim 1, wherein the signal correction device comprises a digital tracking filter, wherein an output of the digital tracking filter is coupled to an output of the analog-to-digital converter and wherein the signal correction device is configured to generate the reduction signal on the basis of an output signal of the digital tracking filter.

14. A method for analog-to-digital conversion, comprising:
　　receiving an analog input signal,
　　amplifying the analog input signal,
　　converting the amplified analog input signal into a digital signal,
　　generating a first signal with high-value bits and a second signal with low-value bits based on the digital signal,
　　generating a reduction signal based on the first signal, and
　　subtracting a reduction signal from the analog input signal before amplification.

15. The method of claim 14, further comprising adding a correction signal to the digital signal if the first signal has a value which is different from 0.

16. The method of claim 15, wherein converting the amplified analog input signal into the digital signal comprises converting, with a sigma-delta analog-to-digital converter, the amplified analog input signal into the digital signal,
　　wherein the adding the correction signal to the digital signal comprises adding within a loop of the sigma-delta analog-to-digital converter.

17. The method of claim 14, further comprising supplying the second signal to a feedback path of an analog-to-digital converter used to convert the amplified analog input signal into the digital signal.

18. The method of claim 14, further comprising electrically isolating at least a part of a signal path for generating the reduction signal from a signal path to an amplifier used for the amplification, if the first signal has a value of 0.

\* \* \* \* \*